(12) United States Patent
Takekoshi

(10) Patent No.: US 8,120,372 B2
(45) Date of Patent: Feb. 21, 2012

(54) PROBE CARD FOR INSPECTING LIGHT RECEIVING DEVICE

(75) Inventor: Kiyoshi Takekoshi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 420 days.

(21) Appl. No.: 12/441,555

(22) PCT Filed: Nov. 5, 2007

(86) PCT No.: PCT/JP2007/071473
§ 371 (c)(1),
(2), (4) Date: Mar. 17, 2009

(87) PCT Pub. No.: WO2008/056627
PCT Pub. Date: May 15, 2008

(65) Prior Publication Data
US 2010/0013505 A1   Jan. 21, 2010

(30) Foreign Application Priority Data
Nov. 9, 2006  (JP) .................... 2006-303997

(51) Int. Cl.
*G01R 31/00* (2006.01)
(52) U.S. Cl. .................................. 324/750.21
(58) Field of Classification Search ........... None
See application file for complete search history.

(56) References Cited

U.S. PATENT DOCUMENTS 6,515,494 B1 * 2/2003 Low ..................... 324/750.23
6,747,464 B1 * 6/2004 Blackwood .............. 324/750.19

FOREIGN PATENT DOCUMENTS

| JP | 10173014 A | 6/1998 |
|---|---|---|
| JP | 200485261 A | 3/2004 |
| JP | 2005044853 A | 2/2005 |
| JP | 2006179601 A | 7/2006 |
| KR | 10-2002-0097336 A | 12/2002 |
| KR | 10-2005-0064531 A | 6/2005 |
| KR | 10-0564655 B1 | 3/2006 |
| TW | 200710401 A | 3/2007 |
| TW | 200725794 A | 7/2007 |

OTHER PUBLICATIONS

International Search report for PCT/JP2007/071473 dated Dec. 11, 2007.
Taiwan Office action for 096141504 dated Mar. 17, 2011.
Korean Office action for 10-2009-7003852 dated Nov. 15, 2010.

* cited by examiner

*Primary Examiner* — Paresh Patel
(74) *Attorney, Agent, or Firm* — Pearne & Gordon LLP

(57) ABSTRACT

The present invention is provided to quickly and efficiently inspect a plurality of CCD sensors. In the present invention, a plurality of openings is formed in a circuit board of a probe card. A plurality of vertical-type probe pins is connected to a lower surface of the circuit board. A guide board is installed at the lower surface of the circuit board, and respective probe pins are inserted into respective guide holes of the guide board. The guide board is made of a transparent glass board. During an inspection, inspection light emitted from a test head passes through the openings of the circuit board and the guide board, so that it is irradiated onto the plurality of CCD sensors on the substrate. Since the plurality of probe pins can be arranged at a narrow pitch without blocking the inspection light, adjacent CCD sensors on the substrate can be inspected simultaneously.

4 Claims, 7 Drawing Sheets

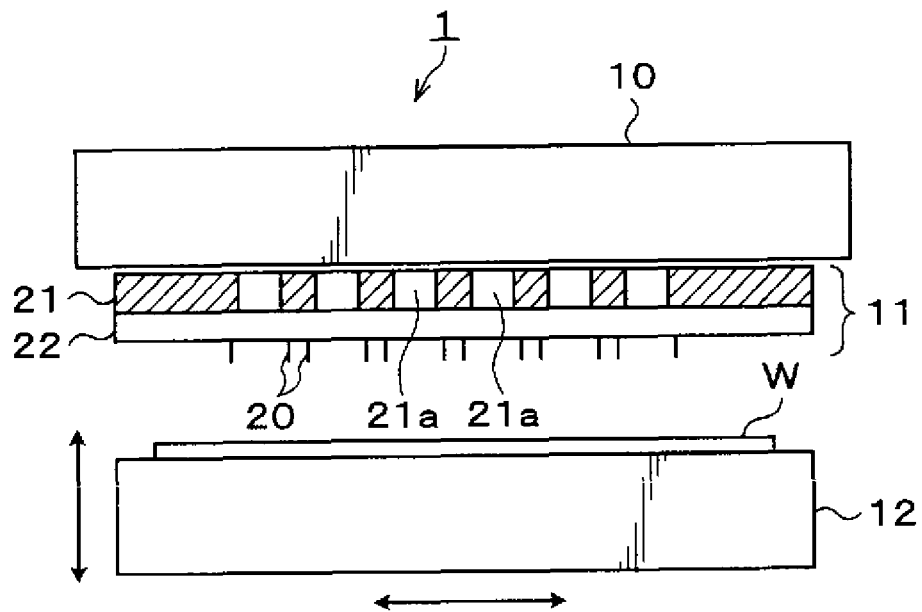
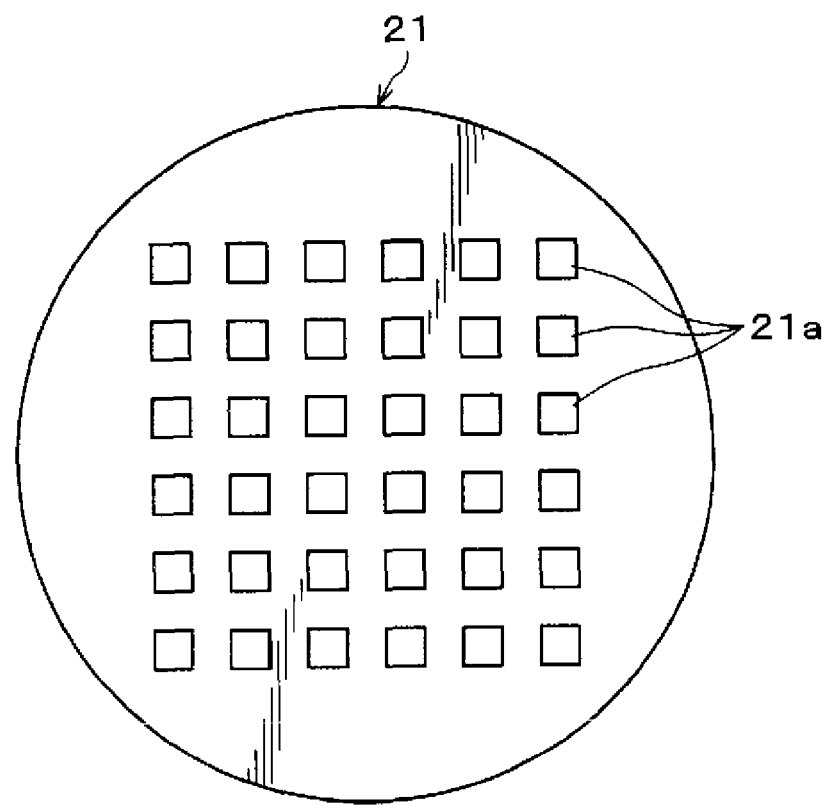

PROBE CARD FOR INSPECTING LIGHT RECEIVING DEVICE

CROSS-REFERENCE TO RELATED APPLICATION

This Application is a U.S. national phase application under 35 U.S.C. §371 of PCT Application No. PCT/JP2007/071473 filed on Nov. 5, 2007, which claims the benefit of Japanese Patent Application No. 2006-303997, filed on Nov. 9, 2006, the entire disclosures of which are incorporated herein by reference in their entirety.

TECHNICAL FIELD

The present invention relates to an inspection probe card for inspecting operations of a plurality of light receiving devices formed on a substrate.

BACKGROUND ART

For example, as illustrated in FIG. 10, solid state imaging devices S such as CCD sensors or CMOS sensors are arranged in column-wise and row-wise on one sheet of substrate W. An inspection of the solid state imaging devices S on the substrate W has been generally performed by using an inspection apparatus, and it is performed by irradiating an inspection light onto a pixel area A located at the center of each solid state imaging device S and detecting output signals from electrode pads P formed around the pixel area A.

The above-stated inspection apparatus conventionally includes plural sets of cantilever-type probe pins, which make contact with the electrode pads P of each solid state imaging device S during the inspection, and a circuit board for supporting the probe pins to receive the output signals. On the circuit board, formed is an opening for allowing the inspection light irradiated from an upper side to pass therethrough toward the solid state imaging device S at a lower side (see Patent Document 1). Further, during the inspection, the opening of the circuit board is located above the solid state imaging device S, and the cantilever-type probe pins are brought into contact with the electrode pads P from an outer side of the solid state imaging device S in order not to block an opening of the solid state imaging device S. Under this circumstance, the inspection light is irradiated onto the pixel area A of the solid state imaging device S through the opening of the circuit board, and the output signals of the electrode pads P are detected from the probe pins.

DISCLOSURE OF THE INVENTION

Problems to be Solved by the Invention

However, in order to quickly and efficiently perform an inspection of solid state imaging devices, it is necessary to simultaneously inspect a plurality of solid state imaging devices on a substrate. However, in the above-stated conventional inspection apparatus, since the cantilever-type probe pins extended in a horizontal direction or inclination direction are brought into contact with the electrode pads from the outer side of each solid state imaging device, the probe pins may block the inspection light from reaching an adjacent solid state imaging device. Therefore, it is impossible to simultaneously perform the inspection of the adjacent solid state imaging devices. For this reason, as illustrated in FIG. 4 of Japanese Patent Laid-open Publication No. 2006-179601 (Patent Document 2), for example, when inspecting solid state imaging devices arranged in column-wise and row-wise, the devices spaced apart from each other at an interval of one device in a diagonal direction are simultaneously inspected or the devices spaced apart from each other at an interval of one device in a lateral direction and two devices in a longitudinal direction are simultaneously inspected. In this case, in order to inspect all of the solid state imaging devices on the substrate, it was necessary to perform inspection several times in a complicated order, so that the inspection took long time and inspection efficiency was very poor.

The present invention is conceived in view of the foregoing, and the object of the present invention is to quickly and efficiently perform the inspection of the solid state imaging devices light receiving devices.

Means for Solving the Problems

In view of the foregoing, there is provided an inspection probe card for inspecting operations of a plurality of light receiving devices formed on a substrate, the inspection probe card including: a plurality of vertical-type probe pins, which is disposed in a vertical direction with respect to the substrate and has elasticity in the vertical direction, for bringing lower end portions thereof into contact with the state imaging devices light receiving devices during an inspection; a circuit board, which is electrically connected with upper end portions of the plurality of vertical-type probe pins at a lower surface thereof, for transmitting and receiving electrical signals for inspection to and from the light receiving devices through the vertical-type probe pins; and a guide board, which is installed at a lower surface side of the circuit board, for guiding the vertical-type probe pins by allowing them to be inserted therein. Further, in the guide board, a plurality of guide holes passing therethrough in a vertical direction is formed, and the vertical-type probe pins are inserted through the guide holes respectively, and the lower end portions of the vertical-type probe pins protrude to a lower side of the guide board; in the circuit board, a plurality of openings through which an inspection light emitted from an upper side passes is formed; and the guide board is made of a transparent material which transmits the inspection light.

In accordance with the present invention, since the vertical-type probe pins are used, it is possible to dispose the probe pins at a narrow distance from each other without blocking the inspection light irradiated onto an adjacent light receiving device. Further, the guide board needed for inserting therethrough the vertical-type probe pins is made of a transparent material, so that it is possible to prevent the guide board from blocking the inspection light. As a result, it is possible to simultaneously perform the inspection of the adjacent light receiving devices and to reduce the number of times for inspecting the plurality of light receiving devices on one sheet of the substrate, and to simplify the order of the inspection. Accordingly, it is possible to quickly and efficiently perform the inspection of the light receiving devices. Further, since a plurality of openings like the ones in the circuit board is not formed on the guide board and the inspection light is transmitted by using the guide board made of a transparent material, the strength of the guide board can be maintained high and thus a plurality of narrow guide holes can be formed on the guide board. As a result, it is possible to dispose more probe pins at a narrow distance from each other, and accordingly, it is possible to inspect many light receiving devices at one time.

The guide board may be made of glass.

The plurality of openings of the circuit board may be arranged in column-wise and row-wise to have a square or rectangular shape as a whole when viewed from the top, and the guide holes of the guide board may be formed around each of the openings when viewed from the top.

Effect of the Invention

In accordance with the present invention, inspections of solid state imaging devices can be performed quickly and efficiently.

BRIEF DESCRIPTION OF THE DRAWINGS

FIG. 1 is a schematic view showing a configuration of an inspection apparatus;
FIG. 2 is a plane view of a circuit board.

EXPLANATION OF CODES

Figure 3:
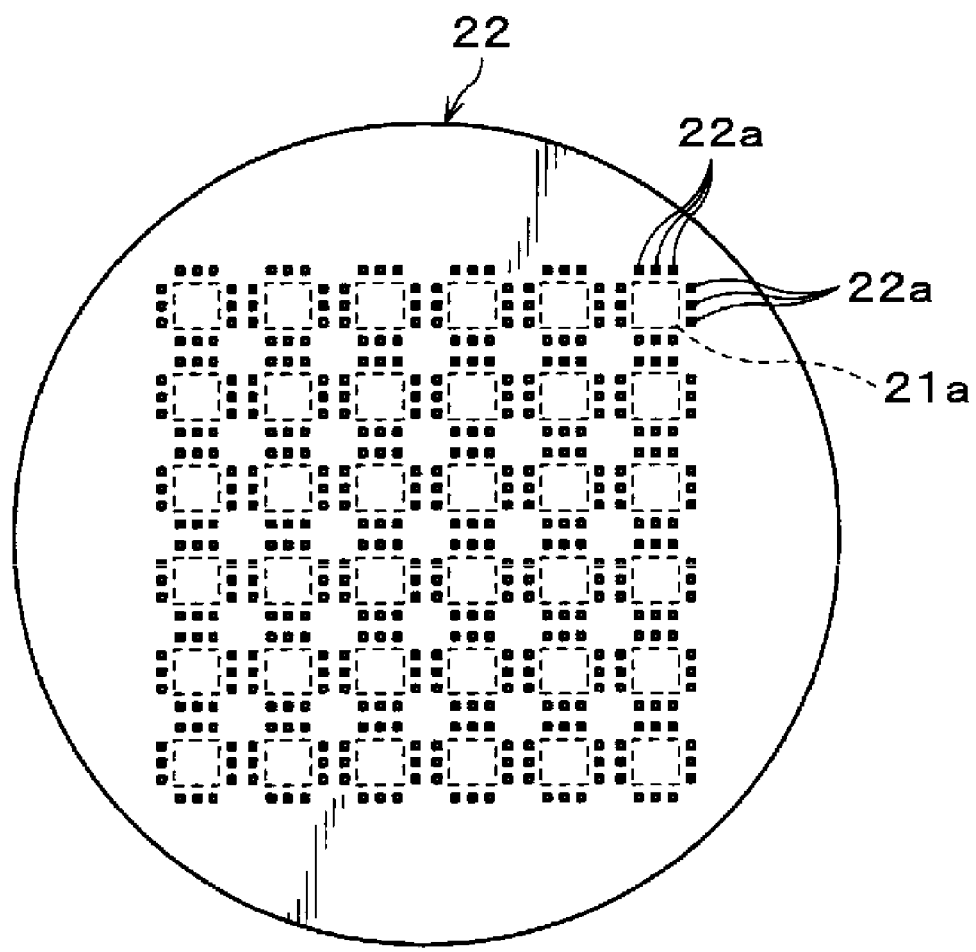
FIG. 3 is a plane view of a guide board.

1: inspection apparatus
11: probe card
20: probe pins
21: circuit board
21a: openings
22: guide board
22a: guide holes
S: CCD sensors
A: pixel areas
P: electrode pads
W: substrate

BEST MODE FOR CARRYING OUT THE INVENTION

Hereinafter, desirable embodiments of the present invention will be explained. FIG. 1 is a schematic view showing a configuration of an inspection apparatus 1 having a probe card for inspection in accordance with the present embodiment mounted thereon.

Figure 10:
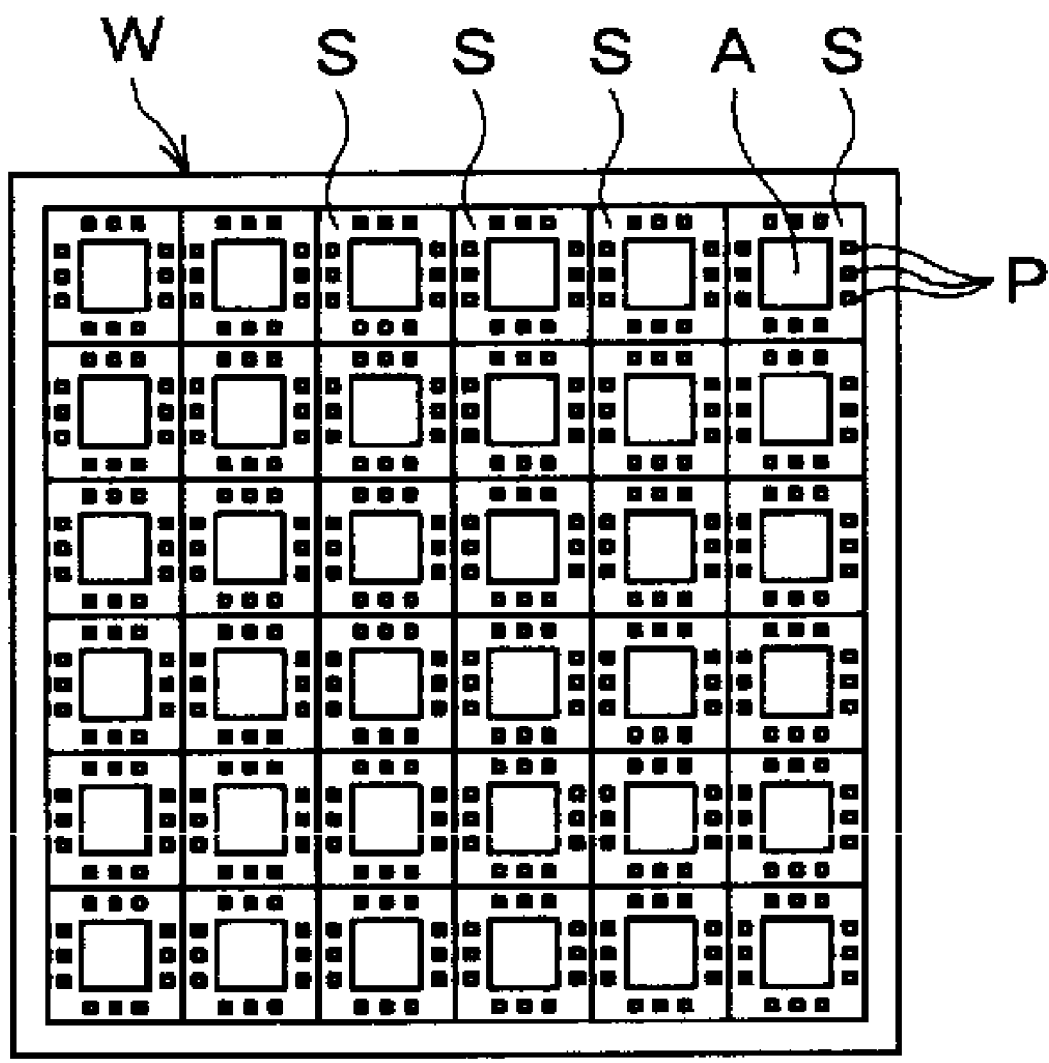
FIG. 10 is a plane view of a plurality of solid state imaging devices formed on one sheet of a substrate.

The inspection apparatus 1 is used for inspecting operation of, for example, a plurality of solid state imaging devices such as CCD sensors S arranged in column-wise and row-wise on a substrate W, as illustrated in FIG. 10. Each of the CCD sensors S has, for example, a square or rectangular pixel area A at the center thereof, and a plurality of electrode pads P are formed around the pixel area A.

The inspection apparatus 1 includes, for example, a test head 10, a probe card 11 in accordance with the present embodiment and a mounting table 12 for mounting thereon the substrate W, as illustrated in FIG. 1.

For example, the test head 10 is provided with an inspection light source on a lower surface thereof, and irradiates an inspection light toward a lower side from the inspection light source.

The probe card 11 is installed, for example, at a lower surface side of the test head 10. The probe card 11 includes, for example, a plurality of vertical-type probe pins 20 for contacting with the CCD sensors S during the inspection, a circuit board 21 transmitting and receiving electrical signals for inspection to and from the CCD sensors S through the probe pins 20, and a guide board 22 having the probe pins 20 inserted therethrough to guide it.

The circuit board 21 is installed, for example, at an uppermost portion of the probe card 11. The circuit board 21 is formed in, for example, a disc shape, as illustrated in FIG. 2. A predetermined electrical circuit is formed inside the circuit board 21. In the circuit board 21, formed is a plurality of openings 21a passing therethrough in a vertical direction, for example. The openings 21a are arranged in column-wise and row-wise at an equal distance when viewed from the top so as to correspond to positions of pixel areas A of respective CCD sensors S of the substrate W mounted on the mounting table 12, for example. In the present embodiment, for example, the openings 21a are arranged in the same manner as the CCD sensors S such that 6 openings 21a in column-wise and 6 openings 21a in row-wise are arranged. Each of the openings 21a is formed in, for example, a square or rectangular shape when viewed from the top. The inspection light irradiated from the test head 10 can pass through the circuit board 21 through these openings 21a.

Figure 4:
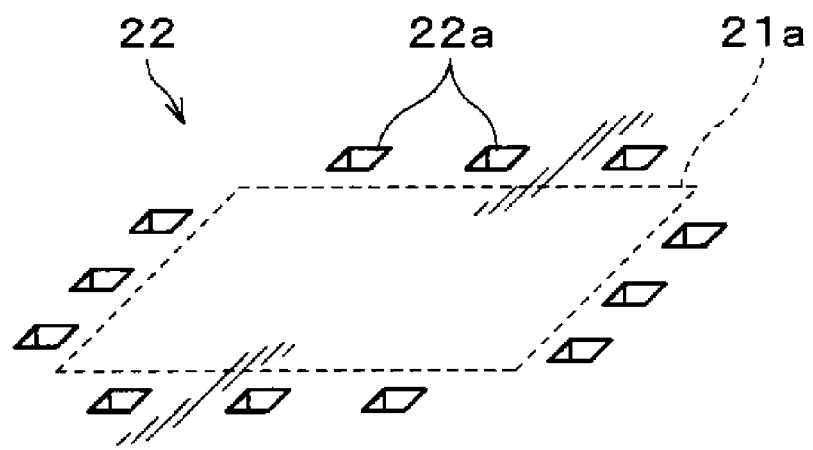
FIG. 4 is an enlarged view of a part of the guide board.

The guide board 22 is installed at the lower surface of the circuit board 21, as illustrated in FIG. 1. The guide board 22 is made of, for example, a transparent glass board having the same level of thermal expansion rate as that of the substrate W and the circuit board 21, and as illustrated in FIG. 3, is formed in a disc shape. The guide board 22 is formed with, for example, a plurality of guide holes 22a passing therethrough in a vertical direction. The guide holes 22a are formed to correspond to positions of respective electrode pads P of respective CCD sensors S of the substrate W mounted on the mounting table 12, for example. For instance, as illustrated in FIGS. 3 and 4, the guide holes 22a are formed around areas (dotted line areas 21a shown in FIGS. 3 and 4) which are defined by projecting each of the openings 21a of the circuit board 21 onto the guide board 22 from the upper side. Each of the guide holes 22a is formed in, for example, a square or rectangular shape when viewed from the top.

Figure 5:
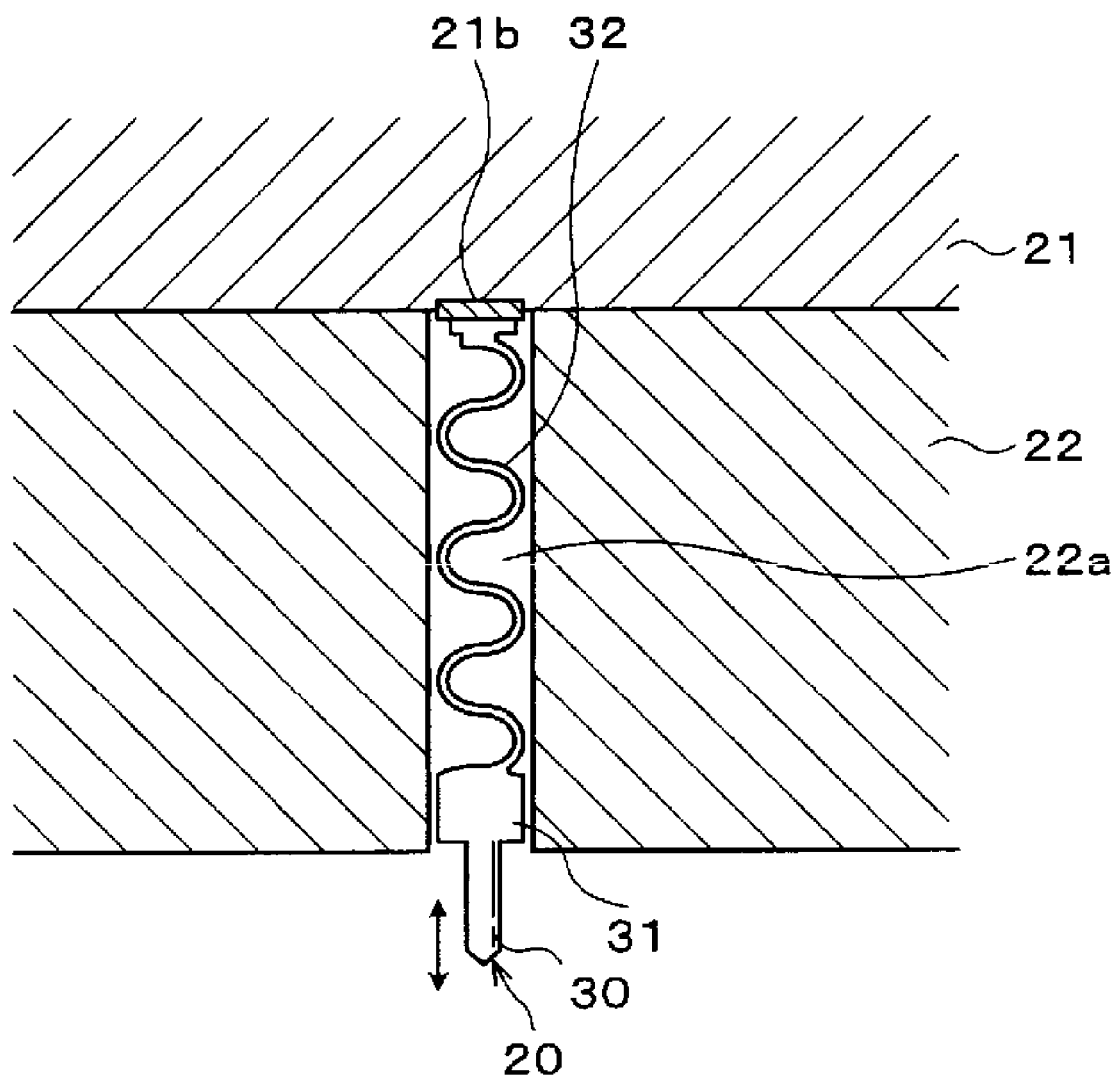
FIG. 5 is a longitudinal cross sectional view of the circuit board and the guide board showing a probe pin which is installed at the circuit board and inserted through the guide board.

As illustrated in FIG. 5, the probe pins 20 have vertical shape, and are disposed vertically, and have elasticity in a vertical direction, for example. An upper end portion of each probe pin 20 is connected to a lower surface terminal 21b of the circuit board 21, and each probe pin 20 is inserted into each guide hole 22a of the guide board 22.

The probe pin 20 includes, e.g., a contact portion 30 at a lower end thereof, a guide portion 31 connected to an upper portion of the contact portion 30, and a spring portion 32 connecting the guide portion 31 with the circuit board 21. The spring portion 32 has, e.g., a wave shape of a continuous strip shape in a vertical direction, and is extensible and contractible in a vertical direction. The guide portion 31 has, e.g., a flat plate shape having approximately a square or rectangular shape, and is formed to have a side length slightly smaller than that of the guide hole 22a. By this guide portion 31, the probe pin 20 is extended and contracted in a vertical direction along the guide hole 22a. The contact portion 30 has a thin front end and protrudes from a lower surface of the guide board 22 toward the lower side.

The mounting table 12 can move, for example, in two orthogonal directions of a horizontal direction and in a vertical direction, so that the mounting table 12 can move the substrate W mounted thereon three-dimensionally.

Figure 6:
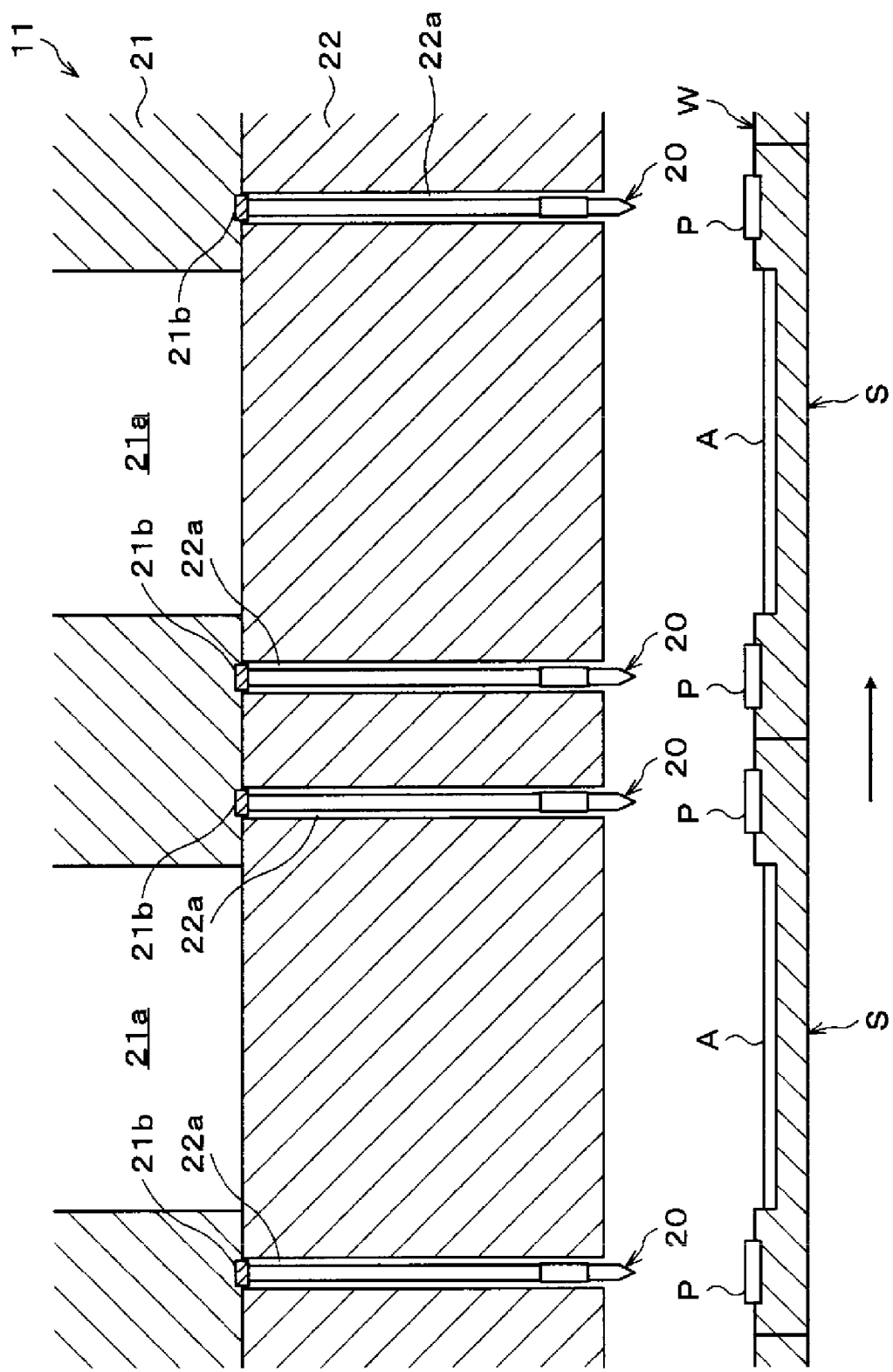
FIG. 6 is a schematic view showing a state in which pixel areas of CCD sensors are moved to lower sides of openings.
Figure 7:
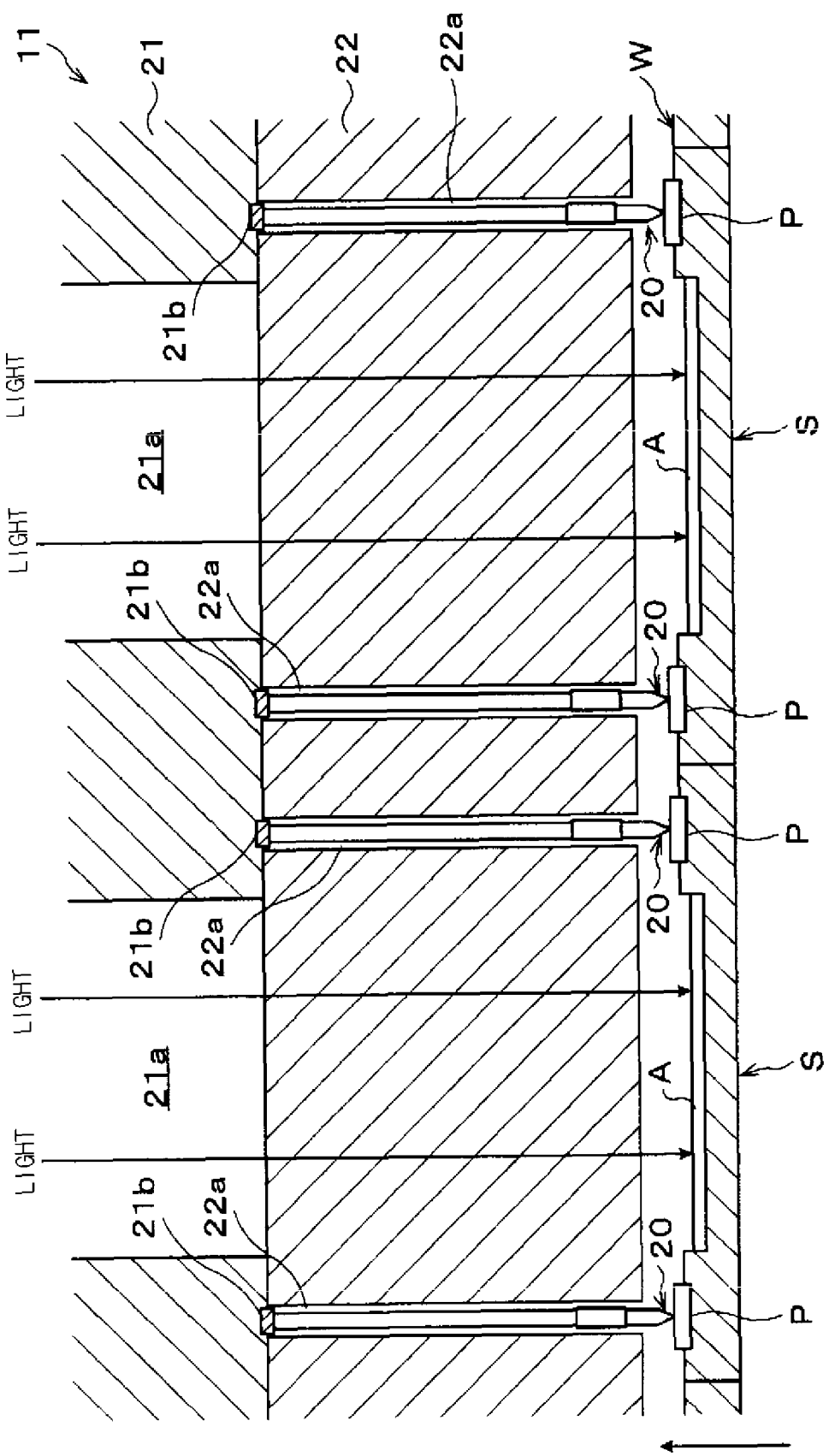
FIG. 7 is a schematic view showing a state in which electrode pads of the CCD sensors are brought into contact with the probe pins.

Hereinafter, an inspection process of the inspection apparatus 1 configured as stated above will be explained. First, the substrate W is mounted on the mounting table 12. Subsequently, as illustrated in FIG. 6, the mounting table 12 moves so that the pixel area A of each CCD sensor S of the substrate W moves to a position corresponding to the lower side of the opening 21a of the circuit board 21, for example. Thereafter, as illustrated in FIG. 7, the substrate W is elevated by the mounting table 12 and pressed by the probe pins 20 of the probe card 11. At this time, for example, each electrode pad P of all CCD sensors S of the substrate W makes contact with the probe pin 20. If each electrode pad P makes contact with the probe pin 20, an inspection light is emitted from the test head 10, for example. The light passes through the opening 21a of the circuit board 21 and transmits through the transparent guide board 22, so that the light is irradiated onto the pixel area A of each CCD sensor S. If the light is irradiated onto the pixel area A, an image signal, which is an electrical signal, is outputted from the electrode pad P and transmitted to the circuit board 21 through the probe pin 20. For instance, this image signal is analyzed by a control unit (not shown), and the operation of each CCD sensor S is inspected.

In accordance with the above-stated embodiment, the probe pin 20 of a vertical type is used, and the guide board 22, through which the probe pin 20 passes, is made of a transparent glass board. In this manner, it is possible to dispose the plurality of probe pins 20 at narrow distance from each other without blocking the inspection light from the upper side. As a result, inspection of the adjacent CCD sensors S can be simultaneously performed so that inspection of the plurality of CCD sensors S on one sheet of the substrate W can be efficiently performed in a short period of time.

Further, in the above-stated embodiment, since an opening like the one in the circuit board 21 is not formed in the guide board 22 and the inspection light is transmitted therethrough by using the transparent glass, the strength of the guide board 22 can be maintained great and a lots of narrow guide holes 22a can be formed in the guide board 22. Accordingly, the plurality of vertical-type probe pins 20 is disposed at the probe card 11, whereby it is possible to perform the inspection of the plurality of CCD sensors S at one time.

Furthermore, in the above-stated embodiment, since the glass board having the same level of thermal expansion rate as that of the substrate W is used as the transparent guide board 22, even if the substrate W is thermally expanded and contracted according to variation of the temperature in the inspection apparatus 1, the guide board 22 is thermally expanded and contracted according thereto, so that it is possible to prevent position deviation of the probe pin 20.

Furthermore, as a method for forming the guide holes 22a in the guide board 22 made of glass, the following method may be used. For example, first, a glass board is accommodated in a container having its top open. Subsequently, pins are uprightly installed in a plurality of holes of a pin standing substrate, and the pin standing substrate is disposed facing the glass board so that the pins face the glass board in the container. Thereafter, the glass board in the container is heated, and the glass board is melted. The pin standing substrate is approached to the melted glass board, and the pins of the pin standing substrate are inserted into the glass board. While the pins are inserted into the glass board, the glass board in the container is cooled and the glass board solidified. Then, the glass board is taken out of the container and the pins inserted into the glass board are removed, whereby the guide holes 22a are formed in the glass board. In this method, the plurality of holes in the pin standing substrate may be formed by using an etching technique. Further, the pins inserted into the glass board may be removed by melting the pins made of metal with aqua regia. By using the above-stated method, it is possible to form the guide holes 22a in the guide board 22 at narrow pitches with a high positional accuracy.

The embodiment of the present invention has been explained with reference to the accompanying drawings, but the present invention is not limited thereto. It shall be understood by those skilled in the art that all modifications and embodiments conceived from the meaning and scope of the claims and their equivalents are included in the scope of the present invention.

For example, in the above-stated embodiment, it may be also possible to divide the substrate W into a plurality of square or rectangular-shaped sections and perform inspection of the CCD sensors S in sequence for each section.

Figure 8:
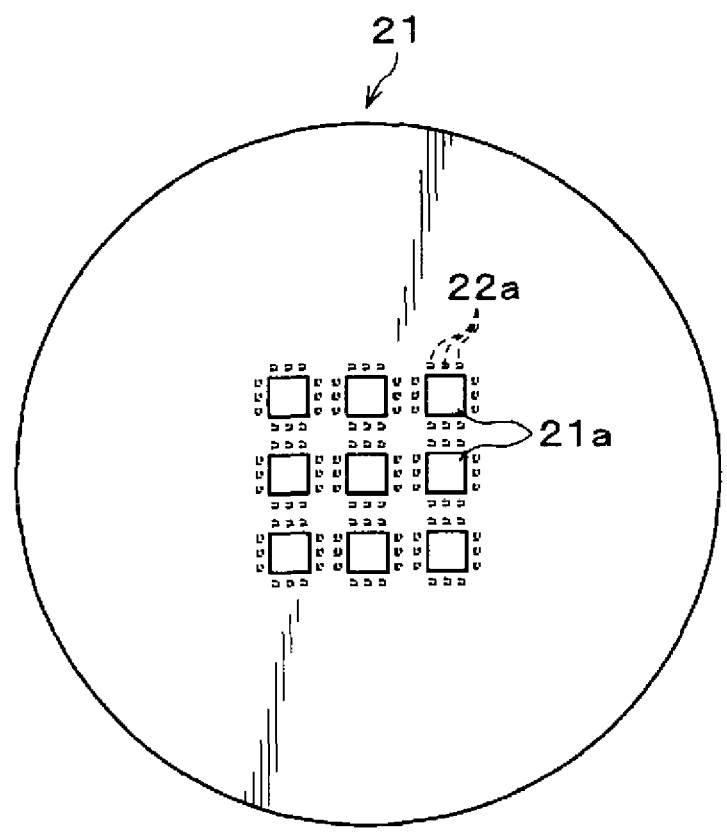
FIG. 8 is a plane view of the circuit board having 3×3 openings formed therein.
Figure 9:
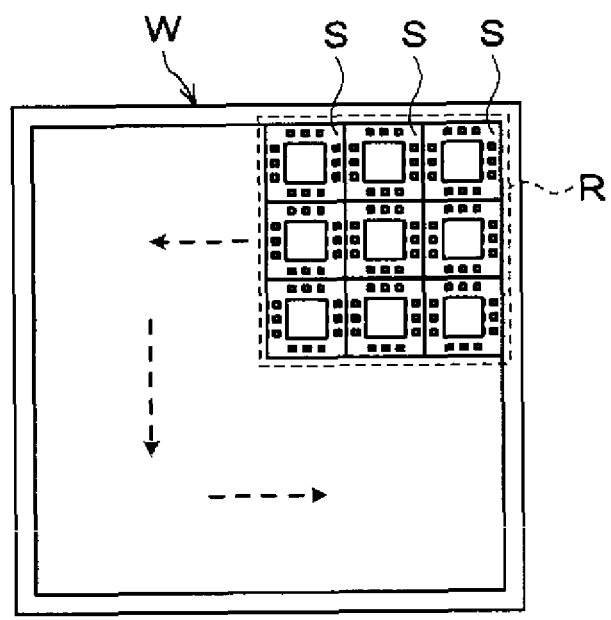
FIG. 9 is a plane view of a substrate showing an inspection area of a square or rectangular shape occupying one fourth of the substrate.

For example, 36 (6×6) CCD sensors S are formed on the substrate W, and as illustrated in FIG. 8, 9 (3×3) openings 21a in column-wise and row-wise are formed in the circuit board 21. In the guide board 22, formed are guide holes 22a (shown by dotted lines in FIG. 8) corresponding to each of these openings 21a. The probe pins 20 are inserted into the guide holes 22a, respectively. In this case, as illustrated in FIG. 9, the CCD sensors S within a square-shaped area R occupying one fourth of the substrate W are simultaneously inspected, and by moving this inspection area R three times, for example, the CCD sensors S on the entire surface of the substrate W are inspected. Even in this case, it is possible to simultaneously perform the inspection of the adjacent CCD sensors S so that the inspection of the CCD sensors S can be performed quickly and efficiently in comparison to the conventional inspection. Furthermore, since the openings 21a are arranged in column-wise and row-wise to form a square shape (inspection area R) as a whole when viewed from the top, it is possible to securely inspect all of the CCD sensors S by a simple horizontal movement of the substrate W. Further, in this example, if the openings 21a are arranged so that the entire inspection area R has a square or rectangular shape, they may be arranged to have different column-wise and row-wise number so that the entire inspection area R has a rectangular shape.

The arrangement of the probe pins 20 or the openings 21a of the circuit board 21 described in the embodiment may be arbitrarily selected depending on the arrangement of the CCD sensors S to be inspected. Further, the shape of the probe pin 20 may vary as long as it is a vertical-type which extends and contracts in a vertical direction. The shape of the guide hole 22a of the guide board 22 is not limited to a square or rectangular shape, and it may be a different shape. The guide board 22 may be made of other transparent materials such as acryl or the like, other than the glass board. Further, the guide board 22 may support the probe pins 20 as well as allow the probe pins 20 to be inserted therein. In addition, the present invention is not limited to the CCD sensor, but it may be applicable for inspecting other solid state imaging devices such as a CMOS sensor or the like.

INDUSTRIAL APPLICABILITY

The present invention is useful for performing inspection of a plurality of light receiving devices of a substrate quickly and efficiently.

What is claimed is:

1. An inspection probe card for inspecting operations of a plurality of light receiving devices formed on a substrate, the inspection probe card comprising:

a plurality of vertical-type probe pins, which is disposed in a vertical direction with respect to the substrate and has elasticity in the vertical direction, for bringing lower end portions thereof into contact with the light receiving devices during an inspection;

a circuit board, which is electrically connected with upper end portions of the plurality of vertical-type probe pins at a lower surface thereof, for transmitting and receiving electrical signals for inspection to and from the light receiving devices through the vertical-type probe pins; and a guide board, which is installed at a lower surface side of the circuit board, for guiding the vertical-type probe pins by allowing them to be inserted therein, wherein, in the guide board, a plurality of guide holes passing therethrough in a vertical direction is formed, and the vertical-type probe pins are inserted through the guide holes respectively, and the lower end portions of the vertical-type probe pins protrude to a lower side of the guide board, in the circuit board, a plurality of openings through which an inspection light emitted from an upper side passes is formed, and the guide board is made of a transparent material which transmits the inspection light.

2. The inspection probe card of claim 1, wherein the guide board is made of glass.

3. The inspection probe card of claim 2, wherein the plurality of openings of the circuit board is arranged in column-wise and row-wise to have a square or rectangular shape as a whole when viewed from the top, and the guide holes of the guide board are formed around each of the openings when viewed from the top.

4. The inspection probe card of claim 1, wherein the plurality of openings of the circuit board is arranged in column-wise and row-wise to have a square or rectangular shape as a whole when viewed from the top, and the guide holes of the guide board are formed around each of the openings when viewed from the top.

* * * * *

UNITED STATES PATENT AND TRADEMARK OFFICE
CERTIFICATE OF CORRECTION

| | | |
|---|---|---|
| PATENT NO. | : 8,120,372 B2 | Page 1 of 1 |
| APPLICATION NO. | : 12/441555 | |
| DATED | : February 21, 2012 | |
| INVENTOR(S) | : Kiyoshi Takekoshi | |

It is certified that error appears in the above-identified patent and that said Letters Patent is hereby corrected as shown below:

Column 2, lines 13-14, please replace "efficiently perform the inspection of the solid state inaging devices light receiving devices." with -- efficiently perform the inspection of the light receiving devices. --

Column 2, lines 24-25, please replace "end portions thereof into contact with the state imaging devices light receiving devices during an inspection" with -- end portions thereof into contact with the light receiving devices during an inspection --

Signed and Sealed this
Twenty-ninth Day of May, 2012

David J. Kappos
*Director of the United States Patent and Trademark Office*